United States Patent
Rajagopalan et al.

[11] Patent Number: 6,111,440
[45] Date of Patent: Aug. 29, 2000

[54] CIRCUIT FOR GENERATING INTERLEAVED RAMPED VOLTAGE SIGNALS HAVING UNIFORM, CONTROLLED MAXIMUM AMPLITUDE

[75] Inventors: Jayendar Rajagopalan; Christopher Falvey, both of Santa Clara; Douglas Robert Farrenkopf, Campbell, all of Calif.

[73] Assignee: National Semiconductor Corporation, Santa Clara, Calif.

[21] Appl. No.: 09/231,046

[22] Filed: Jan. 14, 1999

[51] Int. Cl.[7] ..................................... H03K 4/06
[52] U.S. Cl. ........................ 327/137; 327/131; 327/134
[58] Field of Search ................................. 327/131, 132, 327/133, 134, 137, 140, 336, 341, 344, 345, 363

[56] References Cited

U.S. PATENT DOCUMENTS

| | | | |
|---|---|---|---|
| 3,631,352 | 12/1971 | Kelley | 327/336 |
| 3,657,558 | 4/1972 | Patrickson | 327/134 |
| 3,866,131 | 2/1975 | Figueroa | 327/345 |
| 5,253,155 | 10/1993 | Yamamoto | 363/71 |
| 5,513,094 | 4/1996 | Stanley | 363/98 |
| 5,640,315 | 6/1997 | Hirano et al. | 363/41 |

*Primary Examiner*—Toan Tran
*Assistant Examiner*—Paul Dinh
*Attorney, Agent, or Firm*—Limbach & Limbach L.L.P.

[57] ABSTRACT

A circuit having multiple channels for generating multiple ramped voltage signals (preferably of a type useful in an interleaved PWM dc/dc converter) such that each ramped voltage signal has a different phase, and all the ramped voltage signals have a uniform controlled maximum amplitude. The circuit can be implemented as an integrated circuit (or portion of an integrated circuit) which generates the multiple ramped voltage signals with uniform maximum amplitude in a manner independent of process and temperature variations in implementing and operating such integrated circuit. In preferred embodiments, the circuit includes a single amplifier having an input coupled to receive a reference signal (indicative of a preselected maximum ramped voltage amplitude) and an output which is coupled (in time-division-multiplexed fashion) to each of the ramped voltage generation channels, thus implementing time-division-multiplexed negative feedback loops which control the maximum amplitude of the ramped voltage signal generated by each channel. The input offset voltage error of the amplifier is applied across all channels equally. Preferably, the ramped voltage signal generating circuit also includes circuitry for generating clock signals for controlling generation of the ramped voltage signals. Another aspect of the invention is a method for generating multiple ramped voltage signals (preferably those of a type useful in an interleaved PWM dc/dc converter) such that each ramped signal has a different phase and a uniform, controlled maximum amplitude.

21 Claims, 3 Drawing Sheets

CIRCUIT FOR GENERATING INTERLEAVED RAMPED VOLTAGE SIGNALS HAVING UNIFORM, CONTROLLED MAXIMUM AMPLITUDE

BACKGROUND OF THE INVENTION

1. Field of the Invention

The present invention relates to circuitry for generating ramp signals having controlled maximum amplitude. Preferred embodiments of the invention are circuits for generating multiple ramped voltage signals (for use in interleaved PWM dc/dc converters) such that the ramped voltage signals have constant phase shift and each ramped voltage signal has a controlled maximum amplitude.

2. Description of the Related Art

In power supply circuitry, it is often desired to produce multiple (parallel) channels of ramped voltages. For example, in some DC-DC converters (sometimes referred to as interleaved PWM DC/DC converters, where "PWM" denotes "pulse width modulated"), multiple channels of ramped voltages are provided to comparator circuitry for use in controlling the duty cycle of the DC-DC converter and thus the amplitude of the DC output voltage. The waveforms of the ramped voltages are identical (to the extent possible and practical) except that each has a different phase than the others. An advantage of providing multiple channels of ramped voltages of this type (rather than a single ramped voltage) is that use of multiple channels of ramped voltages allows the DC/DC converter with parallel power-processing channels to be implemented with smaller power stage inductors, smaller input filter inductors, and smaller output capacitors, thus providing an overall improved step-load transient response and reduced physical size.

More generally, circuitry providing multiple channels of ramped voltage signals (all the ramped signals being identical to the extent this can be achieved, except that each has a different phase) is useful for a wide variety of applications, including but not limited to interleaved PWM DC/DC converter applications. However, when implementing such circuitry (especially when implementing it as an integrated circuit or part of an integrated circuit), process and temperature variations typically cause variation from channel to channel in the characteristics (e.g., maximum amplitude) of the ramped voltages.

SUMMARY OF THE INVENTION

In a class of embodiments, the invention is a circuit having multiple channels for generating multiple ramped voltage signals (preferably ramped voltage signals of a type useful in an interleaved PWM dc/dc converter) such that each ramped voltage signal has a different phase, and all the ramped voltage signals have a uniform controlled maximum amplitude. The invention can be implemented as an integrated circuit (or portion of an integrated circuit) which generates such multiple ramped voltage signals with uniform maximum amplitude in a manner independent of process and temperature variations in implementing and operating such integrated circuit. In preferred embodiments, the inventive circuit includes a single amplifier, having an input coupled to receive a reference signal (indicative of a preselected maximum ramped voltage amplitude) and an output which is coupled (in time-division-multiplexed fashion) to each of the ramped voltage generation channels, thus implementing time-division-multiplexed negative feedback loops which control the maximum amplitude of the ramped voltage signal generated by each channel. The input offset voltage error of this amplifier is applied across all channels equally. Thus, the peak amplitude of each of ramped voltage signal is regulated to the level determined by the reference signal.

Preferably, the ramped voltage signal generating circuit of the invention also includes circuitry for generating clock signals for controlling generation of the ramped voltage signals.

Another aspect of the invention is a method for generating multiple ramped voltage signals (preferably ramped voltage signals of a type useful in an interleaved PWM dc/dc converter) such that each ramped voltage signal has a different phase and a uniform, controlled maximum amplitude.

DETAILED DESCRIPTION OF THE PREFERRED EMBODIMENTS

Figure 1:
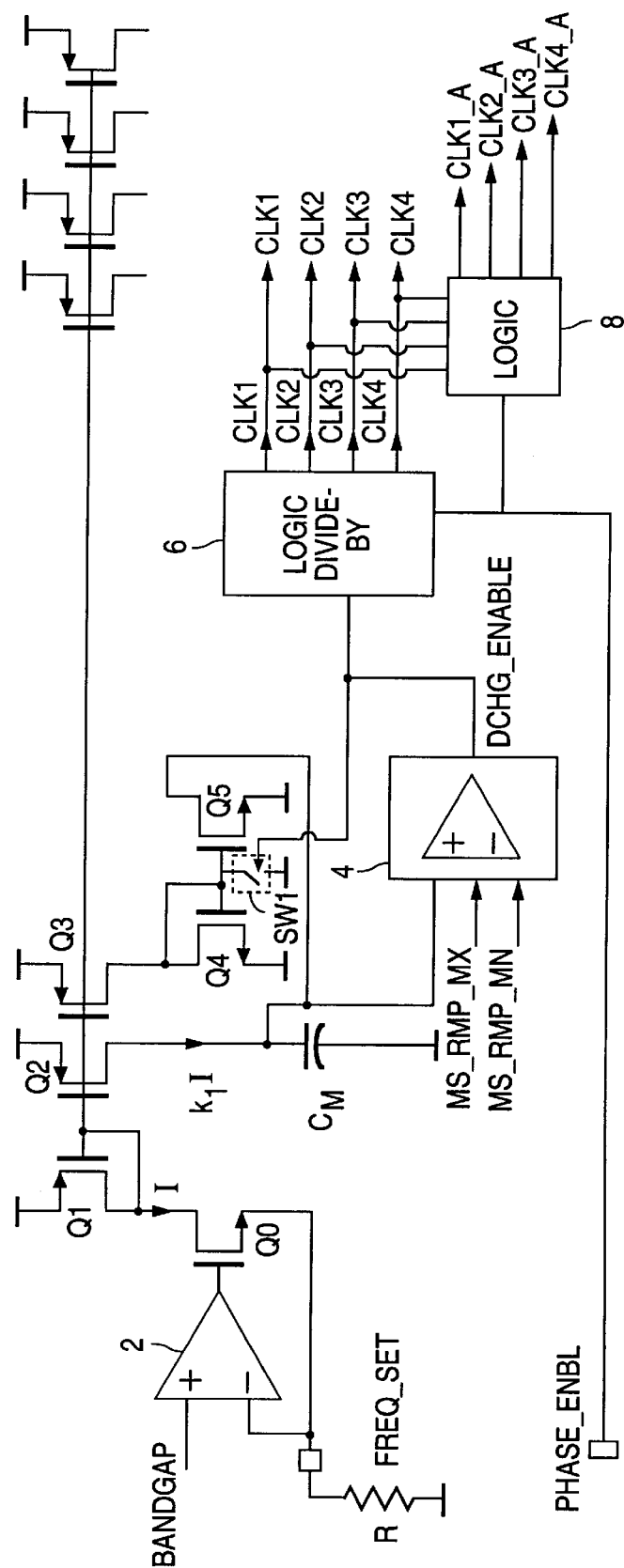
FIG. 1 is a schematic diagram of a first portion of a preferred embodiment of the inventive circuit.
Figure 2:
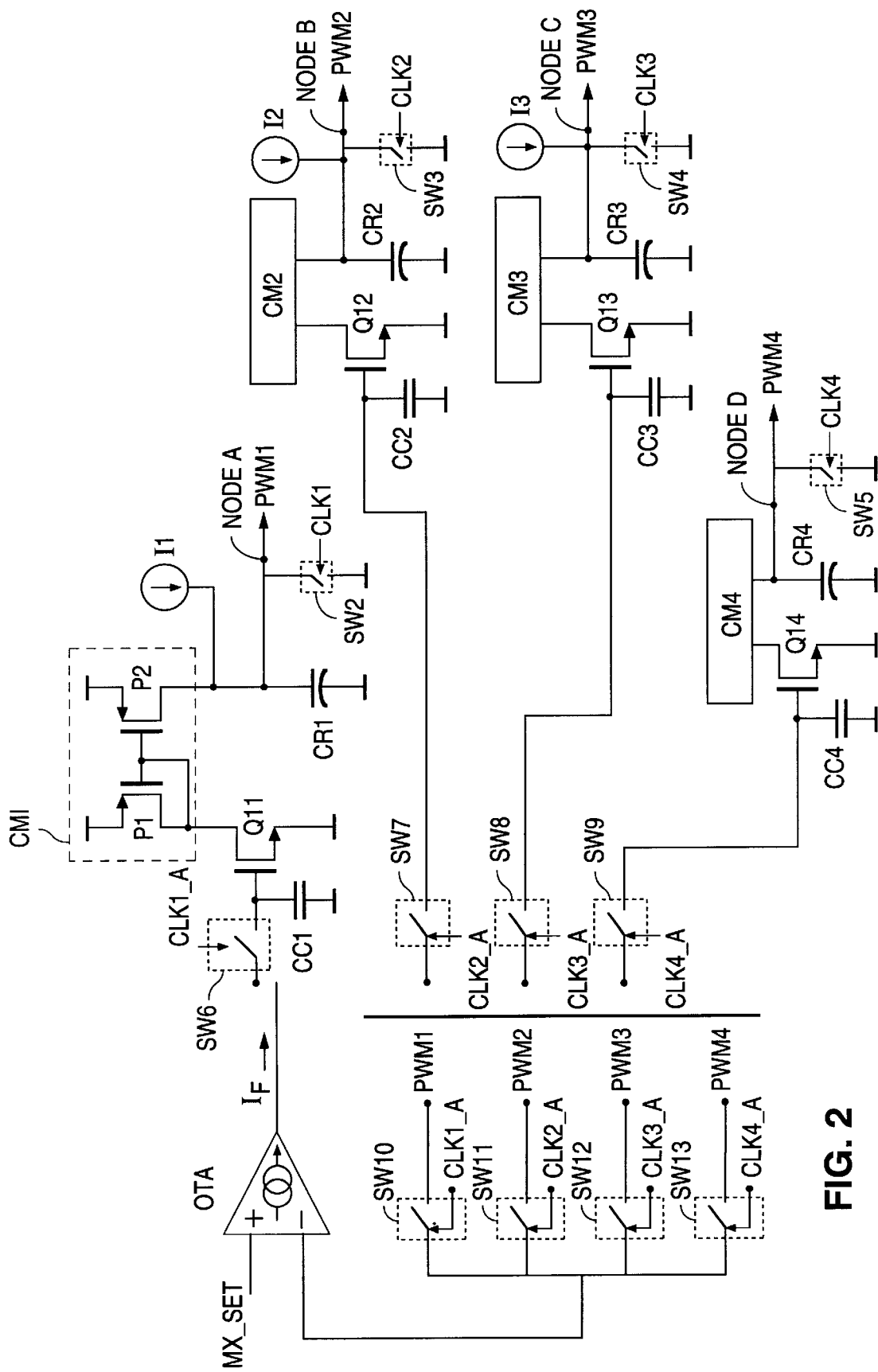
FIG. 2 is a schematic diagram of the remaining portion of the preferred embodiment of the inventive circuit.
Figure 3:
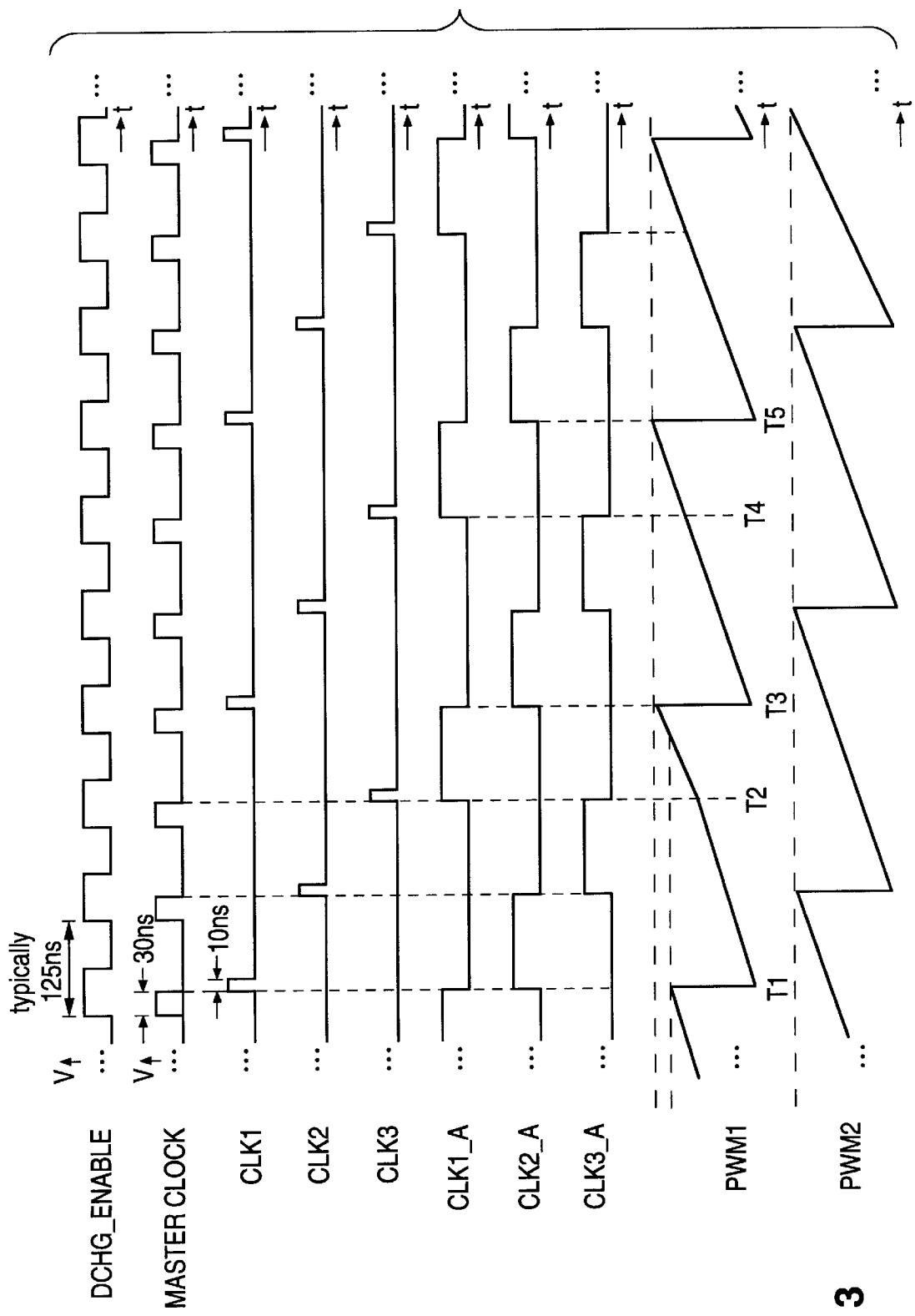
FIG. 3 is a timing diagram showing waveforms of several signals asserted during operation of the circuit of FIGS. 1 and 2.

A preferred embodiment of the inventive circuit will be described with reference to FIGS. 1–3. FIG. 1 is a schematic diagram of the portion of this circuit which generates clock signals CLK1, CLK2, CLK3, CLK4, CLK1_A, CLK2_A, CLK3_A, and CLK4_A, and FIG. 2 is a schematic diagram of another portion of this circuit which generates ramped voltage signals PWM1, PWM2, PWM3, and PWM4. FIG. 3 is a timing diagram showing waveforms of several signals asserted during operation of the circuit of FIGS. 1 and 2 (each waveform of FIG. 3 is voltage as a function of time).

The FIG. 1 circuit includes capacitor $C_M$, circuitry for charging and discharging capacitor $C_M$, circuitry for generating capacitor discharge control signal DCHG_ENABLE, and logic circuits 6 and 8 for generating the clock signals in response to signal DCHG_ENABLE.

It is contemplated that the circuit of FIGS. 1 and 2 (other than resistor R of FIG. 1) is implemented as an integrated circuit or portion of an integrated circuit. The value of the charging current $k_1 I$ for capacitor $C_M$ is determined by the value of external resistor R, the characteristics of the buffered op amp circuit comprising op amp 2, NMOS transistor Q0, and PMOS transistors Q1 and Q2, and the value of a bandgap reference signal provided at the noninverting input terminal of op amp 2. In the buffered op amp circuit, transistors Q1 and Q2 function as a current mirror, and elements 2, Q1, and Q2 are connected as shown. The inverting input terminal of op amp 2 is coupled to the source of Q0. The output terminal of op amp 2 is coupled to the gate of Q0. The drain of Q0 is coupled to the gates of Q1 and Q2 and the drain of Q1. The noninverting input terminal of op amp 2 is coupled to receive the bandgap reference signal. External resistor R (together with the buffered op amp circuit) sets a high-precision, temperature invariant current reference I. The current through the channel of Q2 is $k_1 I$, where $k_1$ is a constant determined by the characteristics of transistors Q1 and Q2. The current $k_1 I$ through the channel of transistor Q2 charges capacitor $C_M$ (when switch SW1 is closed, and thus transistor Q5 is off).

When switch SW1 is in an open state (in response to capacitor discharge control signal DCHG_ENABLE), transistor Q5 is on and thus capacitor $C_M$ discharges (as current flows to ground from its upper plate through the channel of transistor Q5). The value of the discharging current is determined by the current mirror comprising PMOS transistor Q3 and NMOS transistors Q4 and Q5 (connected as shown, with switch SW1 between ground and the common gates of Q4 and Q5). In a preferred implementation, the characteristics of transistors Q3, Q4, and Q5 are chosen so that the discharging current is twice the charging current $k_1I$.

The capacitor discharge current sink is enabled by capacitor discharge control signal DCHG_ENABLE, which control signal is generated by comparator and latch circuit 4. Hysteresis comparator and latch circuit 4 generates control signal DCHG_ENABLE, in response to reference potentials MS_RMP_MX and MS_RMP_MN and the potential ($V_{top}$) of the top plate of capacitor $C_M$, such that control signal DCHG_ENABLE has a pulse waveform (and preferably a 50% duty cycle as shown in FIG. 3). Reference potential MS_RMP_MX is greater than reference potential MS_RMP_MN, and $V_{top}$ has a triangular waveform created by the cyclical charging and discharging of capacitor $C_M$. Control signal DCHG_ENABLE is the output of a latch within circuit 4, and comparator circuitry within circuit 4 sets and resets the latch in response to comparisons of reference potentials MS_RMP_MX and MS_RMP_MN with the top plate potential of capacitor $C_M$. Specifically, the level of control signal DCHG_ENABLE is low when $V_{top}$ needs to be discharged toward MS_RMP_MN. This state occurs soon after $V_{top}$ has reached MS_RMP_MX as detected by the comparator circuitry in circuit 4. Control signal DCHG_ENABLE is high when Q4 and Q5 need to be turned off to enable $V_{top}$ to be charged toward MS_RMP_MX. This state occurs soon after $V_{top}$ has reached MS_RMP_MN as detected by the comparator circuitry in circuit 4.

Switch SW1 enters its open state in response to a high-to-low transition of control signal DCHG_ENABLE. Typically, signal DCHG_ENABLE has a 50% duty cycle as indicated in FIG. 3, with a period of 125 nsec.

Logic circuitry within circuit 6 receives control signal DCHG_ENABLE, and generates a master clock signal (the signal MASTER CLOCK whose waveform is shown in FIG. 3) which is a sequence of narrow pulses (with the rising edge of each narrow pulse of the MASTER CLOCK coinciding with a rising edge of signal DCHG_ENABLE). The pulses of the MASTER CLOCK occur with frequency F. Typically, each narrow pulse of the MASTER CLOCK has a width of 30 nsec, and the frequency F is 8 MHz.

Circuit 6 also includes "divide by N" circuitry, which generates from the MASTER CLOCK a set of N clock signals (where N is an integer greater than one), each having reduced frequency F/N, and each out of phase with respect to the others. Preferably, there is a (360)(n)/N degree phase delay between corresponding pulses of pairs of the clock signals ("n" is an integer in the range from 1 to N−1). The control signal "PHASE_ENBL" is asserted to circuit 6 to select a desired value of N for the "divide by N" circuitry. Preferably, circuit 6 includes a state machine which implements the "divide by N" circuitry, the level of PHASE_ENBL is either logic low (Ground potential) or logic high ($V_{dd}$), and the pin (of the FIG. 1 circuit) to which PHASE_ENBL is asserted programs the state machine to divide down the MASTER CLOCK to generate the desired set of N out-of-phase clock signals.

In a preferred implementation of the FIG. 1 embodiment, circuit 6 implements a selected one of a "divide by three" circuit (which generates three out-of-phase clock signals in response to MASTER CLOCK) and a "divide by four" circuit (which generates four out-of-phase clock signals in response to MASTER CLOCK), and there is a (360)(n)/N degree phase delay between corresponding pulses of pairs of the clock signals ("n" is an integer in the range from 1 to N−1).

In the preferred implementation of FIG. 1, assuming (for the sake of specificity) that the "divide by four" circuitry (N=4) within circuit 6 is selected, circuit 6 asserts clock signals CLK1, CLK2, CLK3, and CLK4 in response to the MASTER CLOCK. Each pulse of each clock signal has 10 ns duration, and has a rising edge that coincides with a falling edge of the MASTER CLOCK. The pulses of CLK1 are phase delayed by 90 degrees relative to the pulses of CLK2 (as indicated in FIG. 3), the pulses of CLK2 are phase delayed by 90 degrees relative to the pulses of CLK3 (as indicated in FIG. 3), and the pulses of CLK3 are phase delayed by 90 degrees relative to the pulses of CLK4.

In the preferred implementation of FIG. 1, if the "divide by three" circuitry within circuit 6 is selected, circuit 6 would assert three clock signals CLK1, CLK2, and CLK3 in response to the MASTER CLOCK, with the pulses of CLK1 phase delayed by 120 degrees relative to the pulses of CLK2, and the pulses of CLK2 phase delayed by 120 degrees relative to the pulses of CLK3.

The FIG. 1 circuit also includes logic circuit 8 which generates a clock signal CLKm_A from each clock signal CLKm (where m is an integer in the range from 1 through N). The falling edge of each pulse of clock signal CLKm_A (and the rising edge of each pulse of signal CLKm) coincides with the falling edge of a pulse of the MASTER CLOCK. Each pulse of clock signal CLKm_A is longer in duration than the corresponding pulse of clock signal CLKm (e.g., each pulse of CLKm_A is 125 nsec in duration in a preferred implementation in which each pulse of CLKm is 10 nsec in duration). For example, in a preferred implementation of FIG. 1, signals CLK1 _A and CLK2_A have waveforms as shown in FIG. 3.

The clock signals CLKm and CLKm_A are provided to circuitry (e.g., that of FIG. 2) which generates multiple channels of ramped voltages. The FIG. 2 embodiment of such circuitry is capable of generating either three or four channels of ramped voltages (either ramped voltage signals PWM1, PWM2, and PWM3, or ramped voltage signals PWM1, PWM2, PWM3, and PWM4), by charging and discharging capacitors CR1, CR2, and CR3 only or all four of capacitors CR1, CR2, CR3, and CR4. With reference to FIG. 2, clock signals CLK1, CLK2, CLK3, and CLK4 (from circuit 6 of FIG. 1) are provided to switches SW2, SW3, SW4, and SW5, respectively. Each of switches SW2, SW3, SW4, and SW5 is closed (allowing the capacitor connected thereto to discharge) when the respective one of signals CLK1, CLK2, CLK3, and CLK4 has a high level.

We sometimes use the term "channel" to refer to the circuitry for generating each ramped voltage, so that the FIG. 2 circuit includes four channels (one channel comprising current source I1, current mirror CM1, and capacitor CR1; another channel comprising I2, CM2, and CR2; a third channel comprising I3, CM3, and CR3; and a fourth channel comprising I4, CM4, and CR4) for generating four ramped voltages (PWM1–PWM4) in parallel. The four ramped voltages themselves are also referred to as four "channels" of ramped voltage signals.

When switch SW2 is open, capacitor CR1 charges (in response to the flow of charge from current source I1 and current mirror CM1 to the top plate of the capacitor). Similarly, capacitor CR2 charges (as charge flows from current source I2 and current mirror CM2 to the top plate of the capacitor) when switch SW3 is open, capacitor CR3 charges (as charge flows from current source I3 and current mirror CM3 to the top plate of the capacitor) when switch SW4 is open, and capacitor CR4 charges (as charge flows from current source I4 and current mirror CM4 to the top plate of the capacitor) when switch SW5 is open.

In an operating mode in which the FIG. 1 circuit generates only CLK1, CLK2, and CLK3, the branch of FIG. 2 containing capacitor CR4 does not function, and the FIG. 2 circuit generates only three out-of-phase ramped voltages PWM1, PWM2, and PWM3.

The FIG. 2 circuit is designed to provide out-of-phase ramped voltages PWM1, PWM2, PWM3, and PWM4 (or PWM1, PWM2, and PWM3) having maximum amplitudes which are determined (for a given frequency of the clock signals CLK1–CLK4) by the ratio of current I1 (of FIG. 2) to current I (of FIG. 1), the ratio of current I2 (of FIG. 2) to current I, the ratio of current I3 (of FIG. 2) to current I, the ratio of current I4 (of FIG. 2) to current I, and the capacitance ratios $CR1/C_M$, $CR2/C_M$, $CR3/C_M$, and $CR4/C_M$ (assuming that the contributions of current mirrors CM1–CM4 can be ignored). However, due to process and temperature variations (in implementing and operating FIG. 1 and FIG. 2 as portions of an integrated circuit), the values of capacitor shift and the variation of MASTER CLOCK frequency with process and temperature (due to variation in comparator propagation delays of circuit 4 of FIG. 1) will directly affect the maximum amplitude of each ramped voltage PWM1, PWM2, PWM3, and PWM4 (or PWM1, PWM2, and PWM3). The variation in maximum amplitude among the ramped voltages (unless corrected in accordance with the invention) has a number of undesirable consequences including the following: the maximum duty ratio shift will vary directly with capacitor variation (when the ramped voltages are used in an interleaved PWM dc/dc converter); the variation in amplitude of the ramped voltages will affect the stability margins of the voltage loop gain of an interleaved PWM dc/dc converter in which the ramped voltages are used; and the variation between amplitude of individual ramped voltages will cause differing duty ratios in each of the channels which will affect the current sharing between the parallel channels.

To alleviate the problems that would otherwise be caused by variation in maximum amplitude among the ramped voltage signals it produces, the FIG. 2 circuit includes current mirrors CM1, CM2, CM3, and CM4, operational transconductance amplifier OTA, NMOS transistors Q11, Q12, Q13, and Q14, capacitors CC1, CC2, CC3, and CC4, correction signal multiplex switches SW6, SW7, SW8, and SW9, and feedback signal multiplex switches SW10, SW11, SW12, and SW13 (connected as shown) in accordance with the invention. A reference signal MX_SET, which is indicative of a desired (preselected) maximum amplitude for each of the ramped voltage signals PWM1–PWM4 (or PWM1–PWM3), is provided to the noninverting input of amplifier OTA. A sequence of different ones of the ramped voltage signals are provided (in time-division-multiplexed fashion) to the inverting input of amplifier OTA. In response, current $I_F$ (whose magnitude depends on the difference between reference signal MX_SET, and the instantaneous level of the relevant one of the ramped voltage signals) flows to (or from) the output of amplifier OTA from (or to) the top plate of one of capacitors CC1, CC2, CC3, and CC4, depending on which of the correction signal multiplex switches SW6, SW7, SW8, and SW9 are closed. The output current $I_F$ of amplifier OTA is negative feedback which is used in a negative feedback loop which tends to move the level of the relevant one of the ramped voltage signals toward the desired maximum amplitude.

Current mirror CM1 comprises PMOS transistors P1 and P2 connected as shown (with their sources at $V_{dd}$, and the gates of P1 and P2 and the drain of P1 connected to the drain of NMOS transistor Q11). Each of current mirrors CM2, CM3, and CM4 has the same structure as current mirror CM1.

We next explain in more detail the operation of the maximum amplitude correction circuitry with reference to the first channel of the FIG. 2 circuit (which produces ramped voltage PWM1). When CLK1_A goes high (at a time when all of CLK1–CLK4 are low), switches SW6 and SW10 close, while all of switches SW2, SW3, SW4, SW5, SW7, SW8, SW9, SW11, SW12, and SW13 remain open. This establishes a feedback loop comprising amplifier OTA, capacitor CC1, transistor Q11, current mirror CM1, and node A (whose potential determines voltage signal PWM1). Capacitor CC1 charges or discharges at a rate which depends on the value of current $I_f$.

If MX_SET>PWM1, then current $I_f$ flows from amplifier OTA to the top plate of capacitor CC1, thus raising the gate potential of transistor Q11. In response, the current through the channel of transistor P2 increases, and thus the voltage across capacitor CR1 (and thus the level of PWM1) increases at greater rate than it would if $I_f$ were zero. In this state, the value of current $I_f$ is negative feedback which causes current mirror CM1 to move the level of ramped voltage signal PWM1 up toward the desired maximum amplitude (during a short interval of time immediately before capacitor CR1 discharges). With reference to FIG. 3, the rising portion of waveform PWM1 between times T2 and T3, has larger slope than it does immediately prior to time T2. Thus, FIG. 3 reflects that MX_SET>PWM1 during each such interval, and that the negative feedback loop of the invention operates to increase the maximum level of each cycle of ramped voltage PWM1 to the desired level. In contrast, the fact that FIG. 3 shows the rising portion of each cycle of ramped voltage PWM2 as having a constant slope indicates that the negative feedback loop of the invention does not affect the maximum level of each cycle of ramped voltage PWM2 (since this maximum level is the desired level).

If MX_SET<PWM1, amplifier OTA would sink a positive current $I_f$ from the top plate of capacitor CC1, thus lowering the gate potential of transistor Q11. In response, the current through the channel of transistor P2 would decrease, and thus the voltage across capacitor CR1 (and thus the level of PWM1) would increase at lower rate than it would if $I_f$ were zero. In this state, the value of current $I_f$ would be negative feedback causing current mirror CM1 to move the level of ramped voltage signal PWM1 down toward the desired maximum amplitude (during a short interval of time immediately before capacitor CR1 discharges).

After CLK1_A has gone low, CLK1 goes high (at a time when CLK2–CLK4 remain low), thus closing switch SW2 and causing capacitor CR1 to discharge. This occurs while switches SW7, SW8, SW9, SW11, SW12, SW13, SW3, SW4, and SW5 remain open.

Then, CLK2_A goes high (at a time when all of CLK2–CLK4 are low) and switches SW7 and SW11 close, while all of switches SW3, SW4, SW5, SW6, SW8, SW9, SW10, SW12, and SW13 remain open. This establishes a feedback loop comprising amplifier OTA, capacitor CC2, transistor Q12, current mirror CM2, and node B (whose potential determines voltage signal PWM2). Capacitor CC2 charges or discharges at a rate which depends on the value of current $I_p$, and CM2 moves the level of ramped voltage signal PWM2 toward the desired maximum amplitude.

Thereafter, CLK3_A goes high (at a time when all of CLK1, CLK3, and CLK4 are low) and switches SW8 and SW12 close, while all of switches SW2, SW4, SW5, SW6, SW7, SW9, SW10, SW11, and SW13 remain open. This establishes a feedback loop comprising amplifier OTA, capacitor CC3, transistor Q13, current mirror CM3, and node C (whose potential determines voltage signal PWM2). Capacitor CC3 charges or discharges at a rate which depends on the value of current $I_p$, and CM3 moves the level of ramped voltage signal PWM3 toward the desired maximum amplitude.

Thereafter, CLK4_A goes high (at a time when all of CLK1, CLK2, and CLK4 are low) and switches SW9 and SW13 close, while all of switches SW2, SW3, SW5, SW6, SW7, SW8, SW10, SW11, and SW12 remain open. This establishes a feedback loop comprising amplifier OTA, capacitor CC4, transistor Q14, current mirror CM4, and node D (whose potential determines voltage signal PWM2). Capacitor CC4 charges or discharges at a rate which depends on the value of current $I_p$, and CM4 moves the level of ramped voltage signal PWM4 toward the desired maximum amplitude.

Since a single amplifier (amplifier OTA) receiving a single reference signal (MX_SET) is used to implement four time-division-multiplexed feedback loops, the input offset voltage error of this amplifier (and other errors) are applied across all four channels equally. Thus, the peak amplitude of each of PWM1–PWM4 is regulated to the level determined by MX_SET (through negative feedback) which causes all of PWM1–PWM4 desirably have the same preselected maximum amplitude and hence the same duty ratio.

Although only a preferred embodiment has been described in detail herein, those having ordinary skill in the art will certainly understand that many modifications are possible without departing from the teachings hereof. For example, one or more of capacitors CR1, CR2, CR3, and CR4 can be replaced by a set of two or more capacitors connected in parallel. All such modifications are intended to be encompassed within the following claims.

What is claimed is:

1. A circuit for generating multiple ramped voltage signals at output nodes such that each of the ramped voltage signals has a controlled maximum amplitude, the circuit including:

multiple channels, each of the channels including at least one capacitor coupled to one of the output nodes, wherein the at least one capacitor is configured to be charged and discharged in controlled fashion so as to produce one of the ramped voltage signals at said one of the output nodes, so that each of the channels produces a different one of the ramped voltage signals at a different one of the output nodes;

a feedback branch having a first input coupled to receive a reference signal and a second input for receiving a selected one of the ramped voltage signals, wherein the reference signal has a level indicative of a preselected maximum amplitude for the ramped voltage signals, and wherein the feedback branch is configured to produce a correction current whose magnitude depends on the difference between the level of the reference signal and a level of the selected one of the ramped voltage signals; and time division multiplexing circuitry, coupled between the feedback branch and the output nodes, and configured to connect the output nodes sequentially to the second input of the feedback branch and to enable flow of the correction current between the feedback branch and each of the channels whose output node is connected to the second input of the feedback branch, whereby flow of the correction current causes said each of the channels to correct the amplitude of the ramped voltage signal produced thereby to reduce any difference between the amplitude of said ramped voltage signal and the preselected maximum amplitude.

2. The circuit of claim 1, also including:

clock signal generation circuitry coupled to the channels, to the feedback branch, and to the time division multiplexing circuitry, said clock signal generation circuitry being configured to assert to the channels a first set of clock signals to cause the channels to produce the ramped voltage signals such that each of the ramped voltage signals has a different phase.

3. The circuit of claim 2, wherein the clock signal generation circuitry is configured to assert a second set of the clock signals to the feedback branch and to the time division multiplexing circuitry, wherein the time division multiplexing circuitry is configured to respond to the second set of clock signals by connecting the output nodes sequentially to the second input of the feedback branch and enabling flow of the correction current between the feedback branch and each of the channels while the output node of said each of the channels is connected to the second input of the feedback branch.

4. The circuit of claim 1, wherein said circuit is an integrated circuit, and the integrated circuit is configured to generate each of the ramped voltage signals to have a maximum amplitude which is at least substantially independent of process and temperature variations in implementing and operating such integrated circuit.

5. The circuit of claim 1, wherein said circuit is a portion of an integrated circuit, and the integrated circuit is configured to generate each of the ramped voltage signals to have a maximum amplitude which is at least substantially independent of process and temperature variations in implementing and operating such integrated circuit.

6. The circuit of claim 1, wherein the feedback branch includes a single amplifier having a first input terminal at said first input, a second input terminal at said second input, and an output terminal, wherein the amplifier sources the correction current to the output terminal when the reference signal has a level exceeding an instantaneous level of the selected one of the ramped voltage signals, and the amplifier sinks the correction current from the output terminal when the instantaneous level of the selected one of the ramped voltage signals exceeds the level of the reference signal.

7. The circuit of claim 6, wherein the amplifier is an operational transconductance amplifier.

8. The circuit of claim 1, wherein the feedback branch includes a single amplifier having a first input terminal at said first input, a second input terminal at said second input, and an output terminal coupled to the time division multiplexing circuitry, wherein each of the channels includes current mirror circuitry coupled to the time division multiplexing circuitry for receiving the correction current, and the current mirror circuitry is configured to assert to the at least one capacitor a supplemental charging current in response to the correction current.

9. The circuit of claim 8, wherein the current mirror circuitry of each of the channels includes:
- a first node connected to the time division multiplexing circuitry;
- a first capacitor having a first conducting element connected to ground and a second conducting element connected to the first node;
- a MOSFET transistor having a gate connected to the second conducting element and a transistor channel connected to a second node; and
- a current mirror connected between the output node of said each of the channels and the second node, wherein the current mirror is configured to assert the supplemental charging current to the at least one capacitor in response to assertion of the correction current to the first node.

10. A circuit for generating multiple ramped voltage signals at multiple output nodes such that each of the ramped voltage signals has a controlled maximum amplitude, said circuit including:
- a first channel including a first capacitor coupled to a first output node, a first current source coupled to the first output node, a first correction current circuit coupled to the first output node, and a first switch coupled between ground and the first output node, whereby the first current source and the first correction current circuit charge the first capacitor when the first switch is open, and the first capacitor discharges when the first switch is closed to produce a first ramped voltage signal at the first output node;
- a second channel including a second capacitor coupled to a second output node, a second current source coupled to the second output node, a second correction current circuit coupled to the second output node, and a second switch coupled between ground and the second output node, whereby the second current source and the second correction current circuit charge the second capacitor when the second switch is open, and the second capacitor discharges when the second switch is closed to produce a second ramped voltage signal at the second output node;
- a feedback branch having a first input coupled to receive a reference signal, a second input for receiving a selected one of the first ramped voltage signal and the second ramped voltage signal, and an output, wherein the reference signal has a level indicative of a preselected maximum amplitude for the first ramped voltage signal and the second ramped voltage signal and the feedback branch is configured to produce at the output a correction signal whose magnitude depends on the difference between the level of the reference signal and a level of the selected one of the first ramped voltage signal and the second ramped voltage signal; and
- time division multiplexing circuitry coupled between the feedback branch, the first output node, the second output node, the first correction current circuit, and the second correction current circuit, the time division multiplexing circuitry having a first state in which it connects the first output node to the second input of the feedback branch and the output of the feedback branch to the first correction current circuit to provide the correction signal to the first correction current circuit, wherein the first correction current circuit is configured to correct the amplitude of the first ramped voltage signal in response to the correction signal to reduce any difference between the amplitude of the first ramped voltage signal and the preselected maximum amplitude, and wherein the time division multiplexing circuitry has a second state in which it connects the second output node to the second input of the feedback branch and the output of the feedback branch to the second correction current circuit to provide the correction signal to the second correction current circuit, and wherein the second correction current circuit is configured to correct the amplitude of the second ramped voltage signal in response to the correction signal to reduce any difference between the amplitude of the second ramped voltage signal and the preselected maximum amplitude.

11. The circuit of claim 10, wherein the feedback branch includes a single amplifier having a first input terminal at said first input, a second input terminal at said second input, and an output terminal at said output, wherein the correction signal is a correction current, the correction current is sourced by the amplifier to the output terminal when the reference signal has a level exceeding an instantaneous level of the selected one of the ramped voltage signals, and the correction current is sunk by the amplifier from the output terminal when the instantaneous level of the selected one of the ramped voltage signals exceeds the level of the reference signal.

12. The circuit of claim 11, wherein the amplifier is an operational transconductance amplifier.

13. The circuit of claim 11, wherein the first correction current circuit includes:
- a first input node connected to the time division multiplexing circuitry;
- a correction circuit capacitor having a first conducting element connected to ground and a second conducting element connected to the first input node;
- a MOSFET transistor having a gate connected to the second conducting element and a transistor channel connected to a second node; and
- a current mirror connected between the first output node and the second node, wherein the current mirror is configured to assert a supplemental charging current to the first capacitor, the supplemental charging current having a magnitude determined by the correction current asserted to the first input node.

14. The circuit of claim 10, wherein the first ramped voltage signal has a first phase and the second ramped voltage signal has a second phase, said circuit also including:
- clock signal generation circuitry coupled to the first channel, the second channel, the feedback branch, and the time division multiplexing circuitry, said clock signal generation circuitry being configured to assert to the first channel and the second channel a first set of clock signals to cause the first channel and the second channel to produce the first ramped voltage signal and the second ramped voltage signal with the second phase different than the first phase.

15. The circuit of claim 14, wherein the clock signal generation circuitry is configured to assert a second set of the clock signals to the feedback branch and to the time division multiplexing circuitry, wherein the time division multiplexing circuitry is configured to respond to the second set of clock signals by connecting the first output node and the second output node sequentially to the second input of the feedback branch.

16. The circuit of claim 10, wherein said circuit is an integrated circuit, and the integrated circuit is configured to generate each of the first ramped voltage signal and the second ramped voltage signal to have a maximum amplitude which is at least substantially independent of process and temperature variations in implementing and operating such integrated circuit.

17. The circuit of claim 10, wherein said circuit is a portion of an integrated circuit, and the integrated circuit is configured to generate each of the first ramped voltage signal and the second ramped voltage signal to have a maximum amplitude which is at least substantially independent of process and temperature variations in implementing and operating such integrated circuit.

18. A method for generating multiple ramped voltage signals such that each of the ramped voltage signals has a different phase and a controlled maximum amplitude, said method including the steps of:

cyclically charging and discharging a first capacitor to produce a first ramped voltage signal having a first phase at a first output node, including by providing a first current and first correction current to the first capacitor during each operation of charging said first capacitor, wherein the first current is fixed and the first correction current is variable;

cyclically charging and discharging a second capacitor to produce a second ramped voltage signal at a second output node, wherein the second ramped voltage signal has a second phase different than the first phase, including by providing a second current and second correction current to the second capacitor during each operation of charging said second capacitor, wherein the second current is fixed and the second correction current is variable;

generating a correction signal during said each operation of charging the first capacitor, by feeding back the first ramped voltage signal to a feedback branch during said each operation of charging the first capacitor while asserting a reference signal to the feedback branch, said reference signal having a level indicative of a preselected maximum amplitude for the first ramped voltage signal and the second ramped voltage signal, and generating the correction signal to have a magnitude which depends on the difference between the level of the reference signal and a level of the first ramped voltage signal;

generating the first correction current in response to the correction signal in such a manner that said first correction current corrects the amplitude of the first ramped voltage signal to reduce any difference between the amplitude of the first ramped voltage signal and the preselected maximum amplitude;

generating the correction signal during said each operation of charging the second capacitor, by feeding back the second ramped voltage signal to the feedback branch during said each operation of charging the second capacitor while asserting the reference signal to the feedback branch, and generating the correction signal to have a magnitude which depends on the difference between the level of the reference signal and a level of the second ramped voltage signal; and generating the second correction current in response to the correction signal in such a manner that said second correction current corrects the amplitude of the second ramped voltage signal to reduce any difference between the amplitude of the second ramped voltage signal and the preselected maximum amplitude.

19. The method of claim 18, wherein a first current mirror coupled to a first MOSFET device and a first correction circuit capacitor coupled to the first MOSFET device are used to generate the first correction current, and wherein the step of generating the first correction current in response to the correction signal includes the steps of:

asserting the correction signal to the first correction circuit capacitor to vary the potential difference across said first correction circuit capacitor, thus varying a gate potential of the first MOSFET device and thereby varying a first current through the first MOSFET device; and controlling the first current mirror by drawing said first current therefrom to cause the first current mirror to generate said first correction current.

20. The method of claim 19, wherein a second current mirror coupled to a second MOSFET device and a second correction circuit capacitor coupled to the second MOSFET device are used to generate the second correction current, and wherein the step of generating the second correction current in response to the correction signal includes the steps of:

asserting the correction signal to the second correction circuit capacitor to vary the potential difference across said second correction circuit capacitor, thus varying a gate potential of the second MOSFET device and thereby varying a second current through the second MOSFET device; and controlling the second current mirror by drawing said second current therefrom to cause the second current mirror to generate said second correction current.

21. The method of claim 18, wherein time division multiplexing circuitry is coupled between the feedback branch, the first output node, and the second output node, and the feedback branch has a first input coupled to receive the reference signal, and also including the step of:

asserting a set of clock signals to the feedback branch and the time division multiplexing circuitry, to cause the time division multiplexing circuitry and the feedback branch to operate in a cycle in which the time division multiplexing circuitry connects the first output node to a second input of the feedback branch while the feedback branch provides the correction signal to a circuit for generating the first correction current, and the time division multiplexing circuitry then connects the second output node to the second input of the feedback branch while the feedback branch provides the correction signal to a second circuit for generating the second correction current.

* * * * *